(12) United States Patent
Laddu et al.

(10) Patent No.: US 11,558,148 B2
(45) Date of Patent: *Jan. 17, 2023

(54) USE OF LDPC BASE GRAPHS FOR NR

(71) Applicant: NOKIA SOLUTIONS AND NETWORKS OY, Espoo (FI)

(72) Inventors: Keeth Saliya Jayasinghe Laddu, Piliyandala (LK); Yi Zhang, Beijing (CN); Jingyuan Sun, Beijing (CN)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 17/345,297

(22) Filed: Jun. 11, 2021

(65) Prior Publication Data

US 2021/0306095 A1 Sep. 30, 2021

Related U.S. Application Data

(63) Continuation of application No. 16/637,118, filed as application No. PCT/CN2017/098135 on Aug. 18, 2017, now Pat. No. 11,070,314.

(51) Int. Cl.
*H03M 13/00* (2006.01)
*H04L 1/00* (2006.01)
*H03M 13/11* (2006.01)

(52) U.S. Cl.
CPC ....... *H04L 1/0057* (2013.01); *H03M 13/1148* (2013.01)

(58) Field of Classification Search
CPC .. H03M 13/1102; H03M 13/09; H03M 13/15; H03M 13/13; H03M 13/1148; H04L 1/0057; H04L 1/0061
See application file for complete search history.

(56) References Cited

U.S. PATENT DOCUMENTS 7,461,325 B2 12/2008 Eroz et al.
7,590,920 B2 * 9/2009 Yang ..................... H03M 13/29
714/779

(Continued)

FOREIGN PATENT DOCUMENTS

CN 1731363 A 2/2006
CN 1825770 A 8/2006

(Continued)

OTHER PUBLICATIONS

Extended European Search Report dated Apr. 20, 2021 corresponding to European Patent Application No. 17921798.9. No copy provided, per MPEP 609. Copy filed in parent U.S. Appl. No. 16/637,118.

(Continued)

*Primary Examiner* — Esaw T Abraham
(74) *Attorney, Agent, or Firm* — Squire Patton Boggs (US) LLP

(57) ABSTRACT

An apparatus is provided which comprises at least one processor, at least one memory including computer program code, and the at least one processor, with the at least one memory and the computer program code, being arranged to cause the apparatus to at least perform generating a code block including information bits and parity bits, the parity bits being generated by performing a cyclic redundancy check on the information bits, determining the number of parity bits used in generating the code block based on an applied linear error correcting code base graph and/or based on the number of the information bits, and encoding the code block by using the applied linear error correcting code base graph.

20 Claims, 3 Drawing Sheets

(56) References Cited

U.S. PATENT DOCUMENTS

| | | | |
|---|---|---|---|
| 8,151,162 B2* | 4/2012 | Kanaoka | H03M 13/2906 714/755 |
| 8,413,025 B2* | 4/2013 | Chen | H03M 13/2906 714/782 |
| 8,572,460 B2 | 10/2013 | Wang et al. | |
| 8,595,588 B2 | 11/2013 | Murakami | |
| 8,713,407 B2 | 4/2014 | Rho | |
| 8,782,499 B2 | 7/2014 | Jeong et al. | |
| 9,071,277 B1* | 6/2015 | Franceschini | H03M 13/2906 |
| 9,350,387 B2* | 5/2016 | Murakami | H03M 13/157 |
| 9,379,848 B2 | 6/2016 | Kliger et al. | |
| 9,432,143 B2 | 8/2016 | Pantelias | |
| 9,548,761 B2* | 1/2017 | Esumi | H03M 13/2906 |
| 9,654,147 B2* | 5/2017 | Moon | H03M 13/293 |
| 10,372,534 B2 | 8/2019 | Berman et al. | |
| 10,630,422 B2 | 4/2020 | Ahn et al. | |
| 10,659,195 B2 | 5/2020 | Zheng et al. | |
| 2002/0120890 A1 | 8/2002 | Calvignac et al. | |
| 2008/0155372 A1 | 6/2008 | Kravitz et al. | |
| 2009/0106626 A1 | 4/2009 | Hou et al. | |
| 2014/0053042 A1 | 2/2014 | Wang et al. | |
| 2017/0279464 A1 | 9/2017 | Noh et al. | |

FOREIGN PATENT DOCUMENTS

| | | |
|---|---|---|
| CN | 101073205 A | 11/2007 |
| CN | 102414991 A | 4/2012 |
| EP | 3 488 529 A1 | 5/2019 |
| EP | 3 605 894 A1 | 2/2020 |

OTHER PUBLICATIONS

Intel Corporation, "LDPC Coding chain," 3GPP Draft; R1-1711344, 3GPP TSG RAN WG1 Meeting NR-Adhoc#2, Dingdao, China, Jun. 26, 2017, XP051300533. No copy provided, per MPEP 609. Copy filed in parent U.S. Appl. No. 16/637,118.

Ericsson, "CRC Attachment for Code Block Group," 3GPP Draft; R1-1707063, 3GPP TSG RAN WG1 Meeting #89,—Iangzhou, China, May 14, 2017, XP051272292. No copy provided, per MPEP 609. Copy filed in parent U.S. Appl. No. 16/637,118.

International Search Report and Written Opinion dated May 22, 2018 corresponding to International Patent Application No. PCT/CN2017/098135. No copy provided, per MPEP 609. Copy filed in parent U.S. Appl. No. 16/637,118.

* cited by examiner

Fig. 3

| MCS index | code rate | bits/symbol | Spectral Efficiency |
|---|---|---|---|
| 0 | 1/30 | 2 | 0,07 |
| 1 | 1/20 | 2 | 0,10 |
| 2 | 1/15 | 2 | 0,13 |
| 3 | 1/12 | 2 | 0,17 |
| 4 | 1/8 | 2 | 0,25 |
| 5 | 1/5 | 2 | 0,40 |
| 6 | 1/3 | 2 | 0,67 |
| 7 | 2/5 | 2 | 0,80 |
| 8 | 1/2 | 2 | 1,00 |
| 9 | 2/3 | 2 | 1,33 |
| 10 | 3/4 | 2 | 1,50 |
| 11 | 4/9 | 4 | 1,78 |
| 12 | 1/2 | 4 | 2,00 |
| 13 | 3/5 | 4 | 2,40 |
| 14 | 2/3 | 4 | 2,67 |
| 15 | 3/4 | 4 | 3,00 |
| 16 | 4/5 | 4 | 3,20 |
| 17 | 5/6 | 4 | 3,33 |
| 18 | 5/9 | 6 | 3,33 |
| 19 | 3/5 | 6 | 3,60 |
| 20 | 2/3 | 6 | 4,00 |
| 21 | 3/4 | 6 | 4,50 |
| 22 | 5/6 | 6 | 5,00 |
| 23 | 2/3 | 8 | 5,33 |
| 24 | 3/4 | 8 | 6,00 |
| 25 | 5/6 | 8 | 6,67 |
| 26 | 8/9 | 8 | 7,11 |
| 27 | 40/43 | 8 | 7,44 |
| 28 | | | Reserved |
| 29 | | | |
| 30 | | | |
| 31 | | | |

5 bit MCS

| MCS index | code rate | bits/symbol | Spectral Efficiency |
|---|---|---|---|
| 0 | 1/30 | 2 | 0,07 |
| 1 | 1/20 | 2 | 0,10 |
| 2 | 1/15 | 2 | 0,13 |
| 3 | 1/12 | 2 | 0,17 |
| 4 | 1/8 | 2 | 0,25 |
| 5 | 1/5 | 2 | 0,40 |
| 6 | 1/3 | 2 | 0,67 |
| 7 | 2/5 | 2 | 0,80 |
| 8 | 1/2 | 2 | 1,00 |
| 9 | 2/3 | 2 | 1,33 |
| 10 | 3/4 | 2 | 1,50 |
| 11 | 4/9 | 4 | 1,78 |
| 12 | 1/2 | 4 | 2,00 |
| 13 | 3/5 | 4 | 2,40 |
| 14 | 2/3 | 4 | 2,67 |
| 15 | 3/4 | 4 | 3,00 |

4 bit MCS

USE OF LDPC BASE GRAPHS FOR NR

CROSS REFERENCE TO RELATED APPLICATION

This application is a Continuation of U.S. patent application Ser. No. 16/637,118 filed Feb. 6, 2020, now U.S. Pat. No. 11,070,314, which is a 371 of International Patent Application No. PCT/CN2017/098135 filed Aug. 18, 2017. The contents of these applications are hereby incorporated by reference.

FIELD OF THE INVENTION

The present invention relates to an apparatus, a method and a computer program product in connection with the use of LDPC base graphs in network such as NR networks.

RELATED BACKGROUND ART

The following meanings for the abbreviations used in this specification apply:
3GPP 3rd Generation Partnership Project
5G 5th Generation
BG Base graph
CB Code block
CBG Code block group
CBS Code block size
CRC Cyclic Redundancy Check
GF(2) Galois field of two elements
gNB 5G base station
FFS For further study
LDPC Low Density Parity Check
LTE Long Term Evolution
MCS Modulation and Coding Scheme
NR New Radio
PC Polar Coding
PCM Parity Check Matrix
TB Transport block
TBS Transport block size
UE user equipment
URLLC ultra-reliable and low latency communications Embodiments of the present invention, although not limited to this, relate to channel coding optimizations in networks such 5G. In the following, some consideration concerning CRC attachment for smaller TBs are given by referring to reference [1]: R1-1711533 "CRC attachment for Smaller TBs" Nokia, Alcatel-Lucent Shanghai Bell.

In Ran1 NR Ad-Hoc #2 meeting, two LDPC base graphs were agreed to support data channel in 5G. The way those are used agreed as the following.

Agreement:
Base graph #1 is used for the initial transmission and subsequent re-transmissions of the same TB when CBS>X or code rate of the initial transmission>Y
Base graph #2 is used for the initial transmission and subsequent re-transmissions of the same TB when CBS<=X and code rate of the initial transmission<=Y
Working assumption: X=2560 and Y=0.67
FFS after PCM decisions if X can be extended to 3840 and/or Y can be extended to 0.75
To be checked how the receiver knows in each case the code rate of the initial transmission, and how exactly it is defined.
FFS whether some UE capabilities may be possible that do not require the implementation of both base graphs.

For CRC attachment, LDPC codes have inherent error detection capability and could be used to reduce the CRC overhead. In Ran1 #88bis meeting, an agreement was made on attaching 24 CRC bits for the TB when the TB is larger than a threshold. However, the threshold was not agreed. In particular, agreement in Ran1 #88bis is:
Agreement:
Number of bits for TB-level CRC is: $L_{TB,CRC}$=24 bits, at least for TBs larger than a threshold (e.g. around 512 bits)
FFS the value of $L_{TB,CRC}$ for TBs smaller than the threshold, and the value of the threshold (0 is not precluded)
If a TB is segmented into 2 or more CBs after code block (CB) segmentation,
CB-level CRC is applied, i.e., CRC bits are attached to each code block individually (as in LTE)
Number bits for CB-level CRC is: $0<L_{CB,CRC}<=24$ bits
Exact value(s) $L_{CB,CRC}$ are to be agreed after base graph(s) are agreed, taking into account inherent LDPC PC capability
FFS whether for a code block group (CBG) containing 2 or more CBs but not all CBs of the TB, any additional CRC bits are attached to the CBG
To be decided after decision on the value(s) of $L_{CB,CRC}$
On MCS table, LTE uses 5 bits to indicate MCS in the control payload. All these would use Turbo code and there is no relation with the MCS table and the use of the coding scheme. For NR, how to utilize this MCS field needs more discussion as the base graph that is used can be different.

In order to optimize the performance is necessary to consider the use of two base graphs when defining other details of NR.

SUMMARY OF THE INVENTION

Embodiments of the present invention address this situation and aim to overcome the above-described problem and to optimize the performance on a coding channel.

According to a first aspect of the present invention an apparatus is provided which comprises at least one processor, at least one memory including computer program code, and the at least one processor, with the at least one memory and the computer program code, being arranged to cause the apparatus to at least perform generating a code block including information bits and parity bits, the parity bits being generated by performing a cyclic redundancy check on the information bits, determining the number of parity bits used in generating the code block based on an applied linear error correcting code base graph and/or based on the number of the information bits, and encoding the code block by using the applied linear error correcting code base graph.

According to a second aspect of the present invention a method is provided which comprises:
generating a code block including information bits and parity bits, the parity bits being generated by performing a cyclic redundancy check on the information bits,
determining the number of parity bits used in generating the code block based on an applied linear error correcting code base graph and/or based on the number of the information bits, and
encoding the code block by using the applied linear error correcting code base graph.

The first aspect and the second aspect may be modified as follows:
For example, the number of parity bits used in generating the code block may be determined based on a comparison of the number of the information bits with a threshold, wherein the threshold may be defined by a maximum code block size supported by the applied linear error correcting code base graph.

The applied linear error correcting code base graph may be selected out of a first linear error correcting code base graph and a second linear error correcting code base graph, wherein the number of parity bits used in generating the code block may be smaller for the second linear error correcting code base graph than for the first linear error correcting code base graph.

The applied linear error correcting code base graph may be selected out of the first linear error correcting code base graph and the second linear error correcting code base graph based on the number of information bits.

The information bits may be included in a transport block and no segmentation of the transport block size may be applied when the second linear error correcting code base graph is used.

The information bits may be included in a transport block and segmentation of the transport block into at least two code blocks may be performed, when the second linear error correcting code base graph is used, wherein in this case the same number of parity bits may be used for each code block as in case no segmentation is applied.

The number of parity bits for the first linear error correcting code base graph may be 24, and/or the number of parity bits for the second linear error correcting code base graph may be 16.

It may be referred to a modulation and coding scheme table based on the applied linear error correcting code base graph when determining the number of parity bits used in generating the code block based on the applied linear error correcting code base graph.

It may be referred to a modulation and coding scheme table for providing information on modulation and coding schemes, wherein the table specifies information on modulation and coding schemes which comprises a nested structure, in which different modulation and coding schemes are referred to by respective indices, wherein the indices are constructed by a number of bits, and the indices indicating modulation and coding schemes relating to the second linear error correcting code base graph are indicated by a number of bits which is smaller than the number of bits of indices indicating modulation and coding schemes relating to the first linear error correcting code base graph.

When the number of bits used for the indices indicating modulation and coding schemes relating to the second linear error correcting code base graph is defined as Y, and the number of bits used for the indices indicating modulation and coding schemes relating to the first linear error correcting code base graph is defined as X, the first X-Y leading bits in the indices indicating modulation and coding schemes relating to the second linear error correcting code base graph may be set to 0.

The linear error correcting code may comprise a LDPC (low density parity check) code and/or a polar code.

According to a third aspect of the present invention an apparatus is provided which comprises at least one processor, at least one memory including computer program code, and the at least one processor, with the at least one memory and the computer program code, being arranged to cause the apparatus to at least perform providing a modulation and coding scheme table including information on modulation and coding schemes, wherein the table specifies information on modulation and coding schemes which comprises a nested structure, in which different modulation and coding schemes are referred to by respective indices, wherein the indices are constructed by a number of bits, and the indices indicating modulation and coding schemes relating to a second linear error correcting code base graph are indicated by a number of bits which is smaller than the number of bits of indices indicating modulation and coding schemes relating to a first linear error correcting code base graph.

According to a fourth aspect of the present invention a method is provided which comprises:

providing a modulation and coding scheme table including information on modulation and coding schemes, wherein the table specifies information on modulation and coding schemes which comprises a nested structure, in which different modulation and coding schemes are referred to by respective indices, wherein the indices are constructed by a number of bits, and the indices indicating modulation and coding schemes relating to a second linear error correcting code base graph are indicated by a number of bits which is smaller than the number of bits of indices indicating modulation and coding schemes relating to a first linear error correcting code base graph.

The third aspect and the fourth aspect may be modified as follows:

When the number of bits used for the indices indicating modulation and coding schemes relating to the second linear error correcting code base graph is defined as Y, and the number of bits used for the indices indicating modulation and coding schemes relating to the first linear error correcting code base graph is defined as X, the first X-Y leading bits in the indices indicating modulation and coding schemes relating to the second linear error correcting code base graph may be set to 0.

The linear error correcting code may comprise a LDPC (low density parity check) code and/or a polar code.

According to a fifth aspect of the present invention a computer program product is provided which comprises code means for performing a method according to the second aspect and/or fourth aspect when run on a processing means or module. The computer program product may be embodied on a computer-readable medium, and/or the computer program product may be directly loadable into the internal memory of the computer and/or transmittable via a network by means of at least one of upload, download and push procedures.

According to a sixth aspect of the present invention an apparatus is provided which comprises means for generating a code block including information bits and parity bits, the parity bits being generated by performing a cyclic redundancy check on the information bits, means for determining the number of parity bits used in generating the code block based on an applied linear error correcting code base graph and/or based on the number of the information bits, and means for encoding the code block by using the applied linear error correcting code base graph.

According to a seventh aspect of the present invention an apparatus is provided which comprises means for providing a modulation and coding scheme table including information on modulation and coding schemes, wherein the table specifies information on modulation and coding schemes which comprises a nested structure, in which different modulation and coding schemes are referred to by respective indices, wherein the indices are constructed by a number of bits, and the indices indicating modulation and coding schemes relating to a second linear error correcting code base graph are indicated by a number of bits which is smaller than the number of bits of indices indicating modulation and coding schemes relating to a first linear error correcting code base graph.

BRIEF DESCRIPTION OF THE DRAWINGS

These and other objects, features, details and advantages will become more fully apparent from the following detailed description of embodiments of the present invention which is to be taken in conjunction with the appended drawings, in which:

FIG. 3 shows an example for a 4 bit MCS and 5 bit MCS table according to an embodiment of the present invention.

DETAILED DESCRIPTION OF EMBODIMENTS

In the following, description will be made to embodiments of the present invention. It is to be understood, however, that the description is given by way of example only, and that the described embodiments are by no means to be understood as limiting the present invention thereto.

In the following, some concerns relating to CRC attachment and generating the MCS table for NR of the inventors are described.

Concerning the CRC attachment, it is noted that in general, the majority of uplink and downlink traffic operate with the smaller TB sizes and good performance is important. Also, the transmission resources are limited, and the number of info bits and CRC bits decides the code rate that the transmission operates. Reducing CRC overhead helps to improve the spectrum efficiency and thus performance, but it should be done without sacrificing the error detection capability of the TB. LDPC codes are capable of providing an extra support on the error detection that can eventually reduce the CRC overhead. In reference [1] described above, the impact of CRC bits on the effective code rate is investigated, where it is observed that CRC bits make a significant change in the effective code rate up to 1000 bits. But, it is noted that some UEs may not implement both base graphs and having an arbitrary number as the threshold could cost the UE implementations. For example, if the UE only operates with Base graph #2, the max TBS that would support with that is 2560 bits (including CRC). So having something like 1000 bits as the boundary create requirements to implement two CRC shift registers at the UE for the same Base graph.

Concerning the MCS field, it is noted that, when finalizing the MCS table for NR, it is needed to make sure that both base graphs #1 and #2 may be operated independently from one another. For example, some UEs may only implement base graph #2 while some may implement only base graph #1. It can be predicted that ultra reliable low latency communication would use base graph #2 and good granularity in terms of spectral efficiency is required in the MCS table. Having random MCS table without thinking of the use of base graphs could lead to some inefficiencies in the NR operation.

In the following, a general overview of an embodiment of the present invention is described by referring to FIGS. 1A and 1B.

Figure 1B:
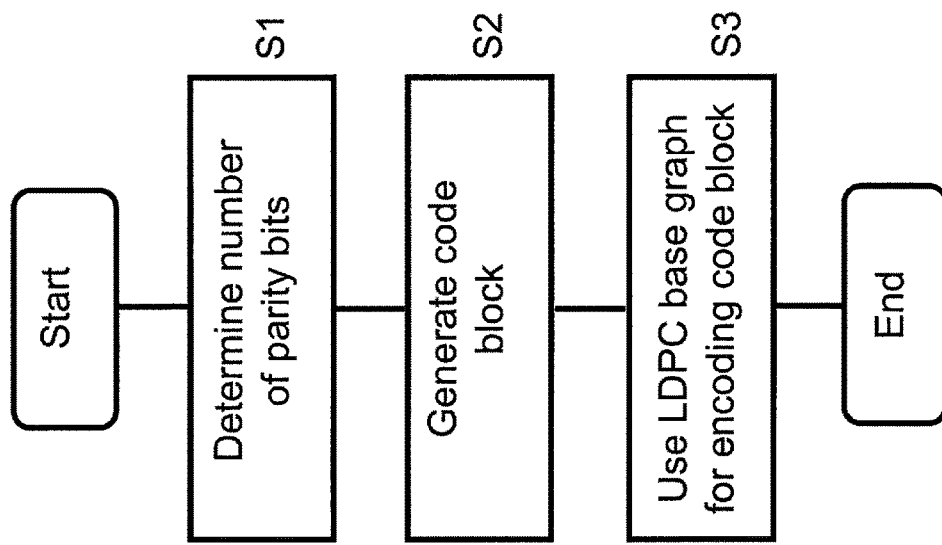
FIG. 1B illustrates a method according to an embodiment of the present invention.
Figure 1A:
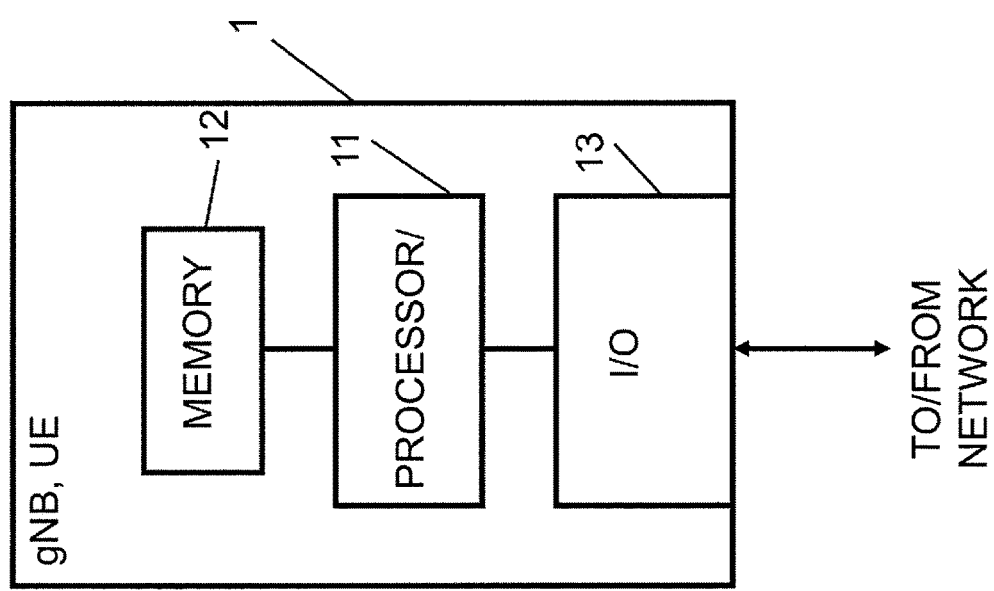
FIG. 1A illustrates an apparatus according to an embodiment of the present invention.

In particular, FIG. 1A shows a UE or gNB 1 as an example for a first apparatus according to the present embodiment. The apparatus 1 comprises at least one processor 11 and at least one memory 12 including computer program code. The at least one processor 11, with the at least one memory 12 and the computer program code, is arranged to cause the apparatus to at least perform generating a code block including information bits and parity bits, the parity bits being generated by performing a cyclic redundancy check on the information bits, determining the number of parity bits used in generating the code block based on an applied linear error correcting code base graph and/or based on the number of the information bits, and encoding the code block by using the applied linear error correcting code base graph.

In other words, by referring to the flowchart shown in FIG. 1B, in step S1 the number of parity bits for generating the code block is determined, namely based on the applied linear error correcting code base graph and/or based on the number of the information bits. In step S2, the code block is generated, and in step S1, the code block is encoded using the linear error correcting code base graph.

The linear error correcting code may be a LDPC code, for example.

Hence, the number of parity bits used for CRC differs based on the applied LDPC base graph and/or the number of information bits. In this way, performance on the channel can be optimized.

Moreover, when determining the number of parity bits used in generating the code block based on the applied linear error correcting code (e.g., LDPC) base graph, it can be referred to an MCS table based on linear error correcting code base graph. That is, for example the MCS table may contain an indication how many parity bits should be used depending on the applied LDPC base graph.

The apparatus 1 may further comprise input/output (I/O) units or functions (interfaces) 13 connected to the processor 11, in order to provide connections to other elements in a network or the like.

Moreover, in the apparatus 1, the at least one processor 11, with the at least one memory and the computer program code, may also be to cause the apparatus to at least perform providing a modulation and coding scheme [MCS] table including information on modulation and coding schemes, wherein the table specifies information on modulation and coding schemes which comprises a nested structure, in which different modulation and coding schemes are referred to by to by respective indices, wherein the indices are constructed by a number of bits, and the indices indicating modulation and coding schemes relating to a second linear error correcting code base graph are indicated by a number of bits which is smaller than the number of bits of indices indicating modulation and coding schemes relating to a first linear error correcting code base graph.

It is noted that the above procedures may also be carried out by another apparatus than the apparatus 1, i.e., another apparatus than a UE or a gNB.

Hence, according to some embodiments of the present invention, CRC and MCS table(s) are considered for the 5G LDPC code. That is, different length CRC's are used depending on the selected base graph and/or number of info bits. A second aspect considers an organization of modulation and coding sets (MCS). Here the MCS is "nested", i.e. the methods are not consecutive, and may be overlapping.

Thus, according to embodiments of the present invention, a method of defining a threshold for CRC length and MCS table are provided.

In this way, performance can be optimized.

In the following, some more details of embodiments of the present invention are described.

According to some embodiments of the present invention, CRC attachment is different for different base graphs and it will be defined based on the TBS threshold.

When LDPC base graph #2 is used, segmentation of TBS is not used.

The value of the threshold is defined by the maximum code block size supported by the LDPC base graph #2. For example, the value of the threshold can be 2560−L bits, where L is the CRC length.

CRC length will be smaller for base graph #2 than what used above the threshold.

When code rate is above the maximum supported by the Base graph #2, the TBS below the threshold still uses similar CRC length.

Furthermore, the MCS table will contain a nested structure that provides good granularity in the spectral efficiency for both base graph #1 and base graph #2.

X bit MCS field is used to represent a full MCS table. i.e., when using both base graphs.

Figure 2:
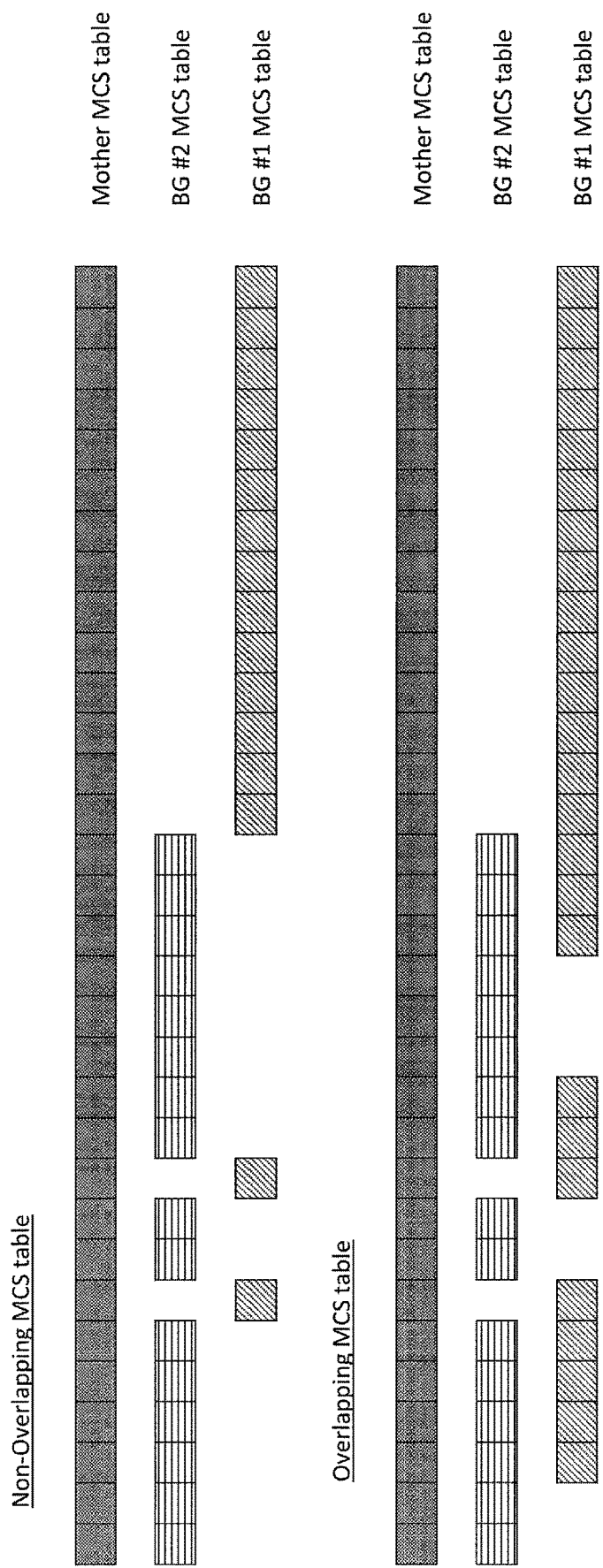
FIG. 2 shows a nested MCS table for base paragraph #2 according to an embodiment of the present invention.

Y<X bit MCS field is used for base graph #2. An example for this is shown in FIG. 2.

The system can operate only with a single base graph, where it can use a lower number of bits for the MCS field.

In the following, some further detailed embodiments are described.

First, the CRC attachment is described, wherein it is assumed that the maximum code block size supported by the LDPC paragraph #2 is 2560.

In this example, the input bits to the CRC computation are denoted by $a_0, a_1, a_2, a_3, \ldots, a_{A-1}$, and the parity bits are denoted by $p_0, p_1, p_2, p_3, \ldots, p_{L-1}$, where A is the size of the input sequence and L is the number of parity bits. The parity bits are generated by one of the following cyclic generator polynomials:

$$g_{CRC24A}(D)=[D^{24}+D^{23}+D^{18}+D^{17}+D^{14}+D^{11}+D^{10}+D^7+D^6+D^5+D^4+D^3+1] \text{ or}$$

$$g_{CRC24B}(D)=[D^{24}+D^{23}+D^6+D^5+D+1]$$

$$g_{CRC16}(D)=[D^{16}+D^{12}+D^5+1]$$

The encoding is performed in a systematic form, which means that in GF(2), the polynomial:

$$a_0 D^{A+L-1}+a_1 D^{A+L-2}+\ldots+a_{A-1}D^L+p_0 D^{L-1}+p_1 D^{L-2}+\ldots+p_{L-2}D^1 p_{L-1}$$

yields a remainder equal to 0 when divided by the corresponding CRC generator polynomial.

The bits after CRC attachment are denoted by $b_0, b_1, b_2, b_3, \ldots, b_{B-1}$, where B=A+L. The relation between $a_k$ and $b_k$ is:

$b_k=a_k$ for $k=0,1,2,\ldots,A-1$ $b_k=p_{k-A}$ for $k=A,A+1,A+2,\ldots,A+L-1$.

If A is no larger than the $2560-L_1$, a CRC sequence of $L=L_1$ bits is attached to the TBS. For example, L1=16. Otherwise, a CRC sequence of L=24 bits is attached to the TBS.

In the following embodiment, a more detailed example concerning the MCS table is described.

An MCS table for URLLC or UEs that uses BG #2 can use 4 bit MCS index such that it is nested inside the big MCS table. Redefining TBS sizes or keeping spate tables may not need in such cases.

FIG. 3 shows a corresponding example, wherein the left part shows a 4 bit MCS table, whereas the right part shows a 5 bit table. The 4 bit MCS table is nested within the 5 bit MCS table. Hence, a UE (or gNB) which only supports BG #2 can refer to the 4 bit MCS table within the 5 bit MCS table by setting the leading bit to zero.

The invention is not limited to the specific embodiments described above, and various modifications are possible.

For example, in the above embodiments, specific numbers are given. However, the invention is not limited on these. That is, for example the maximum code block size supported by the LDPC base graph #2 is not limited to 2560 and can be any suitable number.

Moreover, according to the above embodiments, the number of LDPC base graphs, of which the applied LDPC base graph is to be selected, is two. However, the number can be higher.

Furthermore, in the above embodiments, an LDPC code was used for channel coding. However, the present invention is not limited to this, and any other suitable linear error correcting code can be applied, for example a Polar code.

Moreover, it is also possible to use different coding schemes, for example Polar coding for short blocks and LDPC for large blocks. The CRC attachment may not require to be different due to different inherent error detection (LDPC has inherent detection. Polar code does not). However, it is possible to match the CRC lengths in order to simplify the implementation. In this way, the same error detection capability can be provided across the operating regions. For example, it is possible to append 19 CRC parity bits for polar codes and use the same size for LDPC codes.

Furthermore, in the above embodiments it was described that in case of using the LDPC base graph #2, no segmentation is applied. However, the invention is not limited to this. That is, according to an alternative embodiment, a transport block including the information bits may be segmented into at least two code blocks when the second linear error correcting code (e.g. LDPC) base graph is used. In this case, the same number of parity bits is used for each code block as in case no segmentation is applied. That is, the CRC attachment is kept equal for TB and CB level, so that the implementation is simplified.

Moreover, when using segmentation with BG #2, CRC overhead may be considered when determining the number of CBx. For this, the number of CBs may be determined as follows:

For example, if the TB size is B and CRC attachment we need for TB and CB is L, the number of CBs can be found as follows:

Number of $CBs=\text{Ceil}(B+L/(2560-L))$

It is noted that the operation "Ceil( )" indicates the smallest integer greater than or equal to the given number.

Moreover, a threshold can be used for deciding whether to apply segmentation or not. In this case, the maximum size that Base graph #2 supports should be the threshold. For example, TB+CRC=2560 should be the threshold, when 2560 is the maximum size that Base graph #2 supports.

For the purpose of the present invention as described herein above, it should be noted that method steps likely to be implemented as software code portions and being run using a processor at a network element or terminal (as examples of devices, apparatuses and/or modules thereof, or as examples of entities including apparatuses and/or modules therefore), are software code independent and can be specified using any known or future developed programming language as long as the functionality defined by the method steps is preserved;

generally, any method step is suitable to be implemented as software or by hardware without changing the idea of the invention in terms of the functionality implemented;

method steps and/or devices, units or means likely to be implemented as hardware components at the above-defined apparatuses, or any module(s) thereof, (e.g., devices carrying out the functions of the apparatuses according to the embodiments as described above, eNode-B etc. as described above) are hardware independent and can be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), etc., using for example ASIC (Application Specific IC (Integrated Circuit)) components, FPGA (Field-programmable Gate Arrays) components, CPLD (Complex Programmable Logic Device) components or DSP (Digital Signal Processor) components;

devices, units or means (e.g. the above-defined apparatuses, or any one of their respective means) can be implemented as individual devices, units or means, but this does not exclude that they are implemented in a distributed fashion throughout the system, as long as the functionality of the device, unit or means is preserved;

an apparatus may be represented by a semiconductor chip, a chipset, or a (hardware) module comprising such chip or chipset; this, however, does not exclude the possibility that a functionality of an apparatus or module, instead of being hardware implemented, be implemented as software in a (software) module such as a computer program or a computer program product comprising executable software code portions for execution/being run on a processor;

a device may be regarded as an apparatus or as an assembly of more than one apparatus, whether functionally in cooperation with each other or functionally independent of each other but in a same device housing, for example.

It is noted that the embodiments and examples described above are provided for illustrative purposes only and are in no way intended that the present invention is restricted thereto. Rather, it is the intention that all variations and modifications be included which fall within the spirit and scope of the appended claims.

What is claimed is:

1. An apparatus, comprising:
at least one processor; and
at least one memory including computer program code,
the at least one processor, with the at least one memory and the computer program code, being configured to cause the apparatus to at least perform:
determining a cyclic generator polynomial and a number of parity bits based on a number of information bits;
generating a code block, wherein the parity bits are generated from the information bits by the cyclic generator polynomial;
applying a linear error correcting code for encoding the code block, wherein the linear error correcting code is selected out of a first linear error correcting code base graph and a second linear error correcting code base graph, wherein the number of bits used in generating the code block is smaller for the second linear error correcting code base graph than for the first linear error correcting code base graph; and
encoding the code block by the selected linear error correcting code base graph.

2. The apparatus according to claim 1, wherein the at least one processor, with the at least one memory and the computer program code, is arranged to cause the apparatus to further perform
determining the number of parity bits used in generating the code block based on a comparison of the number of the information bits with a threshold.

3. The apparatus according to claim 2, wherein the threshold is defined by a maximum code block size supported by the applied linear error correcting code base graph.

4. The apparatus according to claim 1, wherein the information bits are included in a transport block and no segmentation of the transport block size is applied when the second linear error correcting code base graph is used.

5. The apparatus according to claim 1, wherein at least one of the number of parity bits for the first linear error correcting code base graph is 24, or the number of parity bits for the second linear error correcting code base graph is 16.

6. The apparatus according to claim 1, wherein the parity bits are generated by one of the following cyclic generator polynomials:

$$g_{CRC24A}(D)=[D^{24}+D^{23}+D^{18}+D^{17}+D^{14}+D^{11}+D^{10}+D^{7}+D^{6}+D^{5}+D^{4}+D^{3}+1],$$

$$g_{CRC24B}(D)=[D^{24}+D^{23}+D^{6}+D^{5}+D+1], \text{ or}$$

$$g_{CRC16}(D)=[D^{16}+D^{12}+D^{5}+1].$$

7. The apparatus according to claim 1, wherein the encoding is performed in a systematic form and, in a Galois field of two elements (GF(2)), the polynomial $a_0 D^{A+L-1} + a_1 D^{A+L-2} + \ldots + a_{A-1} D^L + p_0 D^{L-1} + p_1 D^{L-2} + \ldots + p_{L-2} D^1 p_{L-1}$ yields a remainder equal to 0 when divided by the corresponding cyclic generator polynomial, wherein input bits to cyclic redundancy check (CRC) computation are denoted by $a_0, a_1, a_2, a_3, \ldots, a_{A-1}$, and the parity bits are denoted by $p_0, p_1, p_2, p_3, \ldots, p_{L-1}$.

8. The apparatus according to claim 1, wherein the bits after cyclic redundancy check (CRC) attachment are denoted by $b_0, b_1, b_2, b_3, \ldots, b_{B-1}$, where B=A+L, wherein A is the size of the input sequence and L is the number of parity bits, and wherein the relation between $a_k$ and $b_k$ is given by:

$$b_k=a_k \text{ for } k=0,1,2,\ldots,A-1$$

$$b_k=p_{k-A} \text{ for } k=A,A+1,A+2,\ldots,A+L-1.$$

9. The apparatus according to claim 1, wherein the information bits are included in a transport block and the at least one processor, with the at least one memory and the computer program code, are configured to cause the apparatus to further perform:
segmentation of the transport block into at least two code blocks when the second linear error correcting code base graph is used,
wherein the number of code blocks is determined as:

number of code blocks=Ceil(B+L/(2560−L)), where the operation "Ceil( )" indicates the smallest integer greater than or equal to the given number, B is the transport block size, and L is the number of" parity bits.

10. The apparatus according to claim 1, wherein at least one of the first linear error correcting code base graph or the second linear error correcting code base graph comprises a low density parity check (LDPC) code base graph.

11. A method, comprising:
determining a cyclic generator polynomial and a number of parity bits based on a number of information bits;
generating a code block, wherein the parity bits are generated from the information bits by the cyclic generator polynomial;
applying a linear error correcting code for encoding the code block, wherein the linear error correcting code is selected out of a first linear error correcting code base graph and a second linear error correcting code base graph, wherein the number of bits used in generating the code block is smaller for the second linear error correcting code base graph than for the first linear error correcting code base graph; and
encoding the code block by the selected linear error correcting code base graph.

12. The method according to claim 11, further comprising:
determining the number of parity bits used in generating the code block based on a comparison of the number of the information bits with a threshold,
wherein the threshold is defined by a maximum code block size supported by the applied linear error correcting code base graph.

13. The method according to claim 11, wherein the information bits are included in a transport block and no segmentation of the transport block size is applied when the second linear error correcting code base graph is used.

14. The method according to claim 11, wherein at least one of the number of parity bits for the first linear error correcting code base graph is 24, or the number of parity bits for the second linear error correcting code base graph is 16.

15. The method according to claim 11, wherein the parity bits are generated by one of the following cyclic generator polynomials:

$g_{CRC24A}(D)=[D^{24}+D^{23}+D^{18}+D^{17}+D^{14}+D^{11}+D^{10}+D^{7}+D^{6}+D^{5}+D^{4}+D^{3}+1]$, $g_{CRC24B}(D)=[D^{24}+D^{23}+D^{6}+D^{5}+D+1]$, or $g_{CRC16}(D)=[D^{16}+D^{12}+D^{5}+1]$.

16. The method according to claim 11, wherein the encoding is performed in a systematic form and, in a Galois field of two elements (GF(2)), the polynomial $a_0 D^{A+L-1}+$ $a_1 D^{A+L-2}+\ldots+a_{A-1}D^{L}+p_0 D^{L-1}+p_1 D^{L-2}+\ldots+p_{L-2}D^{1}p_{L-1}$ yields a remainder equal to 0 when divided by the corresponding cyclic generator polynomial, wherein input bits to cyclic redundancy check (CRC) computation are denoted by $a_0, a_1, a_2, a_3, \ldots, a_{A-1}$, and the parity bits are denoted by $p_0, p_1, p_2, p_3, \ldots, p_{L-1}$.

17. The method according to claim 11, wherein the bits after cyclic redundancy check (CRC) attachment are denoted by $b_0, b_1, b_2, b_3, \ldots, b_{B-1}$, where B=A+L, wherein A is the size of the input sequence and L is the number of parity bits, and wherein the relation between $a_k$ and $b_k$ is given by:

$b_k=a_k$ for $k=0,1,2,\ldots,A-1$ $b_k=p_{k-A}$ for $k=A,A+1,A+2,\ldots,A+L-1$.

18. The method according to claim 11, wherein the information bits are included in a transport block and the method comprising:
segmentation of the transport block into at least two code blocks when the second linear error correcting code base graph is used,
wherein the number of code blocks is determined as:

number of code blocks=Ceil(B+L/(2560−L)), where the operation "Ceil( )" indicates the smallest integer greater than or equal to the given number, B is the transport block size, and L is the number of" parity bits.

19. The method according to claim 11, wherein at least one of the first linear error correcting code base graph or the second linear error correcting code base graph comprises a low density parity check (LDPC) code base graph.

20. A non-transitory computer readable medium comprising program instructions stored thereon for performing at least the following:
determining a cyclic generator polynomial and a number of parity bits based on a number of information bits;
generating a code block, wherein the parity bits are generated from the information bits by the cyclic generator polynomial;
applying a linear error correcting code for encoding the code block, wherein the linear error correcting code is selected out of a first linear error correcting code base graph and a second linear error correcting code base graph, wherein the number of bits used in generating the code block is smaller for the second linear error correcting code base graph than for the first linear error correcting code base graph; and
encoding the code block by the selected linear error correcting code base graph.

* * * * *